United States Patent [19]

Ahne et al.

[11] Patent Number: 4,975,347
[45] Date of Patent: Dec. 4, 1990

[54] METHOD FOR MANUFACTURING HEAT-STABLE STRUCTURED LAYERS FROM PHOTOPOLYMERS WHICH ARE ADDITION REACTION PRODUCTS OF OLEFINIC UNSATURATED MONOISOCYANATES AND PHENOL-FORMALDEHYDE RESINS

[75] Inventors: Hellmut Ahne, Röttenbach; Winfried Plundrich, Nüremberg, both of Fed. Rep. of Germany

[73] Assignee: Siemens Aktiengesellschaft, Berlin and Munich, Fed. Rep. of Germany

[21] Appl. No.: 481,783

[22] Filed: Feb. 16, 1990

Related U.S. Application Data

[63] Continuation of Ser. No. 92,471, Sep. 3, 1987, abandoned.

[30] Foreign Application Priority Data

Sep. 11, 1986 [DE] Fed. Rep. of Germany ....... 3630997

[51] Int. Cl.$^5$ .................... G03F 7/038; G03F 7/32
[52] U.S. Cl. ..................... 430/18; 430/325; 430/311; 430/296; 430/14; 430/20; 430/945; 430/942; 430/284; 522/97; 522/96
[58] Field of Search ................. 430/325, 311, 296, 14, 430/18, 20, 945, 942, 284; 522/97, 96

[56] References Cited

U.S. PATENT DOCUMENTS

| | | | |
|---|---|---|---|
| 2,791,504 | 5/1957 | Plambeck, Jr. | 430/325 X |
| 2,997,391 | 8/1961 | Murray et al. | 430/283 X |
| 3,644,289 | 2/1972 | Sayigh et al. | 430/284 X |
| 3,694,415 | 9/1972 | Honda et al. | 260/77.5 |
| 4,304,923 | 12/1981 | Rousseau | 430/284 X |
| 4,390,615 | 6/1983 | Courtney et al. | 430/280 X |
| 4,587,204 | 5/1986 | Davis | 430/325 |

FOREIGN PATENT DOCUMENTS 61-132947  6/1986  Japan .................... 430/284

OTHER PUBLICATIONS

W. S. DeForest, *Photoresist: Materials and Processes*, McGraw-Hill Book Company, New York, NY, 1975, pp. 244–246.

*Primary Examiner*—Cynthia Hamilton
*Attorney, Agent, or Firm*—Kenyon & Kenyon

[57] ABSTRACT

Heat-stable structured layers can be manufactured through the application of radiation-sensitive soluble polymers in the form of a layer or film on a substrate, irradiation of the layer respectively film through negative patterns with actinic light or through the use of a light, electron, laser, or ion beam, removal of the non-irradiated layer respectively film parts and, if necessary, through subsequent tempering, in a cost-effective way in dimension-precise and high-quality form and in a single application process, when the polymers used are photopolymers in the form of addition reaction products of olefinic unsaturated monoisocyates with phenol-formaldehyde resins. The layers produced with this method resist even high thermal and mechanical stress in immersion soldering processes and protect circuit surfaces effectively and permanently against moisture and corrosion; they are therefore suitable for use, in particular as solder resist and insulating layers in microelectronics.

13 Claims, No Drawings

METHOD FOR MANUFACTURING HEAT-STABLE STRUCTURED LAYERS FROM PHOTOPOLYMERS WHICH ARE ADDITION REACTION PRODUCTS OF OLEFINIC UNSATURATED MONOISOCYANATES AND PHENOL-FORMALDEHYDE RESINS

This application is a continuation of application Ser. No. 07/092,471, filed 9/3/87 now abandoned.

BACKGROUND OF THE INVENTION

The invention relates to a method for manufacturing heat-stable structured layers, as well as to the use of these structured layers.

Methods for the manufacture of structured layers based on heat-stable polymers are known, for example from the German patent document 2 308 830 as well as the European patent documents 0 019 123, and 0 026 820. In these methods soluble, photoreactive intermediary stages of highly heatstable polymers are used for photolithographic structuring and the structures thereby produced are cyclized in a subsequent tempering step. For the complete cyclization and removal of the cleavage products temperatures of up to 400° C. are required. This requires thermally highly stressable substrates.

In the fields of circuits and conductors, for example in circuit board technology, substrates based on epoxides are used, which can be thermally stressed up to maximally approximately 150° C./hour and which need to be able to tolerate temperatures of approximately 280° C. only for seconds, for instance during soldering processes. The solder resist lacquers used here to partially cover conducting paths must meet similar thermal demands, i.e. here, for covering the sites of the circuit surface, which must not make contact with the soldering metal, polymers of medium thermal stability are required. The dry resists used at present for this purpose, including respectively silk screening lacquers, based upon epoxides and upon acrylates, meet the requirements of the function of a solder resist mask. However, they only partially fulfill the increased demands with respect to pattern outline accuracy measuring accuracy in the microelectronics field with structures of less than 100 μm, as well as the requisite cycling strength. To this end, photolithographic lacquer systems are required.

A photostructurable lacquer system based on epoxides with chalcon groups built into the polymer chains, i.e. groups having the structure —C$_6$H$_4$—CH=CH—CO—C$_6$H$_4$—, is already available, which would ensure sufficient pattern outline accuracy (see "Chimia", Vol.38 (1984), pages 13 to 20). With respect to the photostructurability, however, relatively long exposure times and, in particular long developing times are involved. Beyond that, use of these known lacquer systems to establish additional permanent protection of the circuit surface against damaging gases, often requires elaborate multiple coating processes. Furthermore, due to the lengthy after-curing times sometimes lasting several hours, the overall process is long and cost-intensive.

An object of the invention, therefore, is to develop a method for making heat-stable structured layers which permit producing precisely dimensioned, high-quality structured layers, in particular on circuit surfaces, in a single coating process. Another object is to develop resistance against the extensive thermal and mechanical stresses, for example, during immersion soldering processes, and, moreover, protect the circuit surfaces effectively and permanently against moisture and corrosion. In addition, it is an object to develop an overall process that is shortened by shorter exposure, developing and tempering times and thus becomes more costeffective. Yet other objects include a developing process which yields highly resolved structures, with the additional possibility of permitting working in aqueous/alkaline media.

SUMMARY OF THE INVENTION

These and other objects are achieved by the invention which is directed to a method for making heat-stable structured layers by applying radiation-sensitive soluble polymers in the form of a layer or film on a substrate, irradiating the layer or film through negative patterns with actinic light or by using a light, electron, laser or ion beam, removing the non-irradiated layer or film portions and hardening, if necessary, by subsequent tempering. According to the invention, the radiation-sensitive polymers are photopolymers in the form of addition reaction products of olefinic unsaturated monoisocyanates and phenol-formaldehyde resins.

DETAILED DESCRIPTION OF THE INVENTION

Within the framework of a cost-efficient process, the method according to the invention permits the production of microstructured protective and insulating layers for the areas of semiconductors and circuits, which permanently and effectively protect the structures and circuits subject to corrosion. A particular advantage is that the developing process does not lead to under-resolution and no solder bridges appear in soldering processes. The method according to the invention fulfills the requirements with respect to measuring accuracy of the generated structures, and allows very high resolution within a broad layer thickness range with short developing times. This method is costeffective because it yields with one single application (with conventional equipment), if necessary after brief tempering, photostructured layers of sufficiently high heat-stability, which, even under conditions of immersion soldering, remain dimensionally stable and tear-free and remain effective as a permanent protection against moisture and corrosion. The good electrical characteristics are not impaired even in humid climates.

In the method according to the invention, when irradiated with actinic light, such as UV light, the photoreactive phenol-formaldehyde resins yield photo cross-linked structures. These structures can be developed in an aqueous/alkaline medium and yield highly resolved relief structures. This is of importance because no precautionary measures such as protection against fire and explosion are required as would be the case when organic developers are used.

The photo cross-linked layers based on phenolformaldehyde resins produced with the method according to the invention are suitable as insulating layers on copper substrates as well as flexible protection and insulating layers on polyimide films and circuit boards with conducting paths (tracks) of copper respectively with copper oxide surfaces. Adhesion on copper, polyimide, and circuit board substrates is very good and fulfills the necessary requirements. In contrast, the structures prepared from known photolacquers based on phenolformaldehyde do not lend themselves to function as permanent protective and insulating layers. These photolacquers, which respresent positively functioning resists, contain, in addition to non-radiation-reactive phenol-formaldehyde resins, up to 30% thermally labile diazoquinones, which impair the insulating properties.

In the method according to the invention the photopolymers can be advantageously used together with light-or radiation-sensitive copolymerizable compounds. To this end, it is preferable to use acrylate and methacrylate group-containing compounds, in particular trimethylolpropane triacrylate and -methacrylate and/or 1,4-butanedioldimethacrylate. It is, however, conceivable to use allyl group-containing compounds, for instance diallyl- and triallyl-cyanurate, as well as N-substituted maleimides. Further, photoinitiators and-/or sensitizers can be used (cf.: "Industrie Chimique Belge", Vol. 24, 1959, pages 739 to 764, as well as J. Kosar, "Light-Sensitive Systems", John Wiley & Sons Inc., New York 1965, pages 143 to 146 and 160 to 188). Especially suitable are alpha-halogenacetophenones, dialkoxyacetophenones, like dimethoxy- and diethoxy-acetophenone, benzoylphosphine oxides, which likewise can be substituted, and Michler's ketone. As photoinitiators or sensitizers, for example benzoin ether, 4,4'-bis(diethylamino)-benzophenone, 2,6-bis(p-azidobenzylidene)-4-methylcyclohexanone, thioxanthones, such as isopropylthioxanthone, and acetophenone are suitable. Furthermore, in the method according to the invention, adhesion promoting agents can be used to advantage. For this, in particular silanes are available, such as vinyltriethoxysilane, vinyl-tris(beta-methoxyethoxy)-silane, gamma-methacryloxypropyltrimethoxysilane, gamma-glycidoxypropyltrimethoxysilane, and gamma-aminopropyltriethoxysilane. To the solutions of the photopolymers, furthermore, mineral filler substances can be added advantageously, in particular based on silicon dioxide and aluminum oxide, as well as other, conventionally used filler substances.

The photopolymers used in the method according to the invention in general have the following structure:

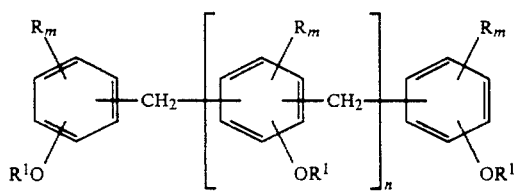

where n=1 to 10 and m=1 to 3.
For R and R¹ the following applies:
R is hydrogen, halogen or an alkyl group;
R¹ is hydrogen or

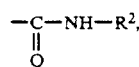

provided that not all R¹'s are hydrogen simultaneously; R² is an olefinic unsaturated group, for example, an allylether- or maleimide-containing group and, in particular an optionally substituted (meth)acrylic ester-containing group, bound by an aliphatic and/or cycloaliphatic and/or aromatic bridge.

The starting materials of the photopolymers can be phenol resins, alkylphenol resins, cresol resins and similar resin systems; these resins, moreover, can be halogenated. Novolaks are preferred as phenol-formaldehyde resins. Novolaks and phenol-formaldehyde resins in general have phenolic hydroxyl groups to which the olefinic unsaturated monoisocyanates attach during the preparation of the photopolymers.

Preferential photopolymers are addition reaction products of isocyanatoethylmethacrylate and novolaks or addition reaction products of novolaks with olefinic unsaturated monoisocyanates in the form of addition reaction products of 2,4-diisocyanatotoluene and hydroxyethyl-acrylate or -methacrylate.

The preparation of the structured layers according to the invention takes place in such manner that the photopolymers in the form of a layer or film are applied on a substrate and exposed to actinic light through a mask or irradiated by using a light, electron, laser, or ion beam. Subsequently the unexposed or non-irradiated layer or film portions are removed or peeled off and so-produced structured layers or relief structures are tempered by heat if necessary. The photopolymer is advantageously applied to the substrate dissolved in an organic solvent. The concentration of the photopolymer in common solvents like cyclohexanone, N-methylpyrrolidone, gamma-butyrolactone and mixtures of these can be selected in such a way that with known coating procedures, like centrifuging, immersion, spraying, casting, silk screening, brushing, or rolling, layer thicknesses of 0.01 to approximately 500 microns can be generated. To achieve a uniform and good surface quality on substrates with smooth surface, casting (a method of this nature is known, for example from the European patent document 0 002 040), silk screening and, in particular electrostatic spray coating and coating by centrifugation at 300 to 10,000 rpm have proven themselves to be of advantage. In the case of non-uniform surfaces, like circuit boards with copper conducting paths on the surface, rpms of 300 to 1500 are advantageous. The range of viscosity of the solutions used for silk screening, spraying and casting preferably lies between 200 and 1500 mPa.s at 23° C.

The photolacquer layer applied on the substrate, which preferentially consists of circuit board material, glass, metal, synthetics or semiconductors, can at room temperature, or preferentially at temperatures of 50 to 80° C., be freed of the solvent in a nitrogen or air stream. It is also possible to work in a vacuum or with infrared radiators respectively on a heated plate.

With the method according to the invention a sufficient solubility differential between the irradiated and the non-irradiated layer or film parts is achieved with the use of a 350 W high-pressure mercury vapour lamp using exposure times between 5 and 400 seconds. Times within this range can be determined as a function of the composition and the layer thickness. After the exposure, and if necessary after an after-drying process, the non-exposed parts are dissolved out with organic solvents. Preferentially, however, aqueous/alkaline media are used.

The structured layers or relief structures prepared with the method according to the invention are remarkable for their edge sharpness, high resolution, tear-free homogeneous surface and for their high thermal stability. They can resist the high thermal and mechanical stresses of an immersion soldering process. Adhesion to the soldering material is very slight, so that, as desired, no soldering pearls adhere to the polymer layer. The structured layers prepared according to the invention are sufficiently elastic to tolerate cycle tests between −65° and +125° C. without tearing. Circuit surfaces covered with the structured layers show, in climate tests at 40° C., 92 % ambient humidity and a voltage of 100 V, no conducting path corrosion. Such layers are thus suitable—in addition to use as solder resist masks—as effective and permanent protective layers against the effects of moisture and harmful gases.

Due to their high degree of purity because of their manner of preparation) the structured layers according to the invention are suitable also as material for passivation layers on semiconductor structural elements, of thin and thick film circuits, of solder resist layers on multiple layer circuits, as well as for insulating layers as components of layer circuits, and for miniaturized protective and insulating layers of electrically conductive and/or semiconductive and/or base materials. In general they are also suitable for microstructuring of substrates and for structure transfer processes, such as wet and dry etching processes, currentless or galvanic metal deposition and vapour deposition processes as well as for masks for ion implantation. Beyond these uses, these layers are suitable for use as insulating and protective layers in the electrical and microelectronics technology, as well as as damping substance for surface wave filters, in particular television medium frequency filters, as orientation layers in liquid crystal displays as well as as dielectric material in multiple layer circuits.

The invention is explained in greater detail below in conjunction with embodiments.

EXAMPLE 1

To a solution of 51.6 parts by weight of the novolak resin Bakelite LG 724 (Bakelite ® is a trade mark of Bakelite GmbH) in 80 parts by weight of cyclohexanone 41.4 parts by weight of pure isocyanatoethylmethacrylate and 0.1 parts by weight of dibutyltindilaurate are added. Subsequently, the mixture is agitated for 48 hours at room temperature. Then to 100 parts by weight of the resin solution 0.5 parts by weight of dichloroacetophenone, 1.5 parts by weight of diethoxyacetophenone, 0.5 parts by weight of Michler's ketone and 0.5 parts by weight of vinyl-tris(beta-methoxyethoxy)-silane are added. Subsequently the solution is pressure-filtered through a 5 μm filter.

The filtered solution of the photoreactive phenol-formaldehyde resin is centrifuged at 400 rmp onto a circuit board test plate with copper conducting paths on the surface and subsequently dried for ½ hour at 70° C. in a circulating air furnace. The thickness of the lacquer layer is at this point 40 microns. After exposure with a 350 W high-pressure mercury vapour lamp through a mask for 10 seconds; after post-drying for 2 minutes at 90° C. in the circulating air furnace; and treating with an aqueous/alkaline developer, like AZ 303 (Shipley) with water used as stopper, for 25 seconds sharp-edged structured layers are obtained. With respect to their surface quality these layers are not impaired even after cycling one hundred times between −65° and +125° C. These layers thus tolerate unimpaired wave soldering and immersion soldering (dip soldering) processes at 260° C.; the soldering material forms pearls which roll off the surface. Moisture tests at 40° C. and 92% ambient humidity and at a voltage of 100 V show no evidence of corrosion of the conducting paths covered with the lacquer.

EXAMPLE 2

To a solution of 66.8 parts by weight of pure 2,4-diiso-cyanatotoluene in 115 parts by weight of dichloromethane while agitating and in the absence of moisture a mixture of 23.6 parts by weight of pure 2-hydroxyethylacrylate and 24.8 of parts by weight of pure 2-hydroxyethylmethacrylate is slowly added dropwise at room temperature. After a reaction time of 30 hours at room temperature, an isocyanate conversion of 98% is determined by titration.

The resulting solution of the photoreactive monoisocyanate is mixed with a solution of 75 parts by weight of the novolak resin Bakelite LG 724 in 60 parts by weight of gamma-butyrolactone and with 0.1 parts by weight of dibutyltindilaurate. After a reaction time of 24 hours at room temperature 15 parts by weight of ethanol are added to the reaction solution. After an additional 24 hours, the solution is ready to be used for coating.

To 100 parts by weight of the solution of the photopolymer prepared in the described way 1.2 parts by weight of 2,4,6-trimethyl-benzoylphosphine oxide, 0.3 parts by weight of Michler's ketone, 0.3 parts by weight of vinyltriethoxysilane and 30 parts by weight of talcum (as filler) are added. By casting lacquer layers, 30 microns thick, are prepared on copper substrates and exposed through a mask with a 350 W high-pressure mercury vapour lamp for 30 seconds. After developing with cyclohexanone and water as the stopper (time: 30 seconds) structures with smooth, tear-free surfaces are obtained. Under immersion soldering conditions these structures are stable even at 260° C: The soldering material does not adhere to the lacquer surface of the structures, but runs off forming pearls.

EXAMPLE 3

103.2 parts by weight of the novolak resin Bakelite 6564 LB are dissolved by heating up to approximately 100° C. with 60 parts by weight of dried cyclohexanone, then mixed with 0.2 parts by weight of dibutyltindilaurate and with 123.8 parts by weight of pure isocyanatoethylmethacrylate and allowed to react at room temperature for approximately 24 hours. Subsequently, to the reaction solution 12 parts by weight of ethanol are added in order to convert the remaining isocyanate groups. The solution is allowed to rest for 24 hours at room temperature.

To 100 parts by weight of the photoreactive phenol-formaldehyde resin prepared as 55% resin solution in the above described manner are added 2.2 parts by weight of benzoinisopropylether, 0.5 parts by weight of Michler's ketone, 2.7 parts by weight of trimethylolpropanetriacrylate and 0.5 parts by weight of vinyl-tris(beta-methoxyethoxy)-silane. The solution is then pressure-filtered through a 5 micron filter. The viscosity of the thus obtained solution is greater than 1000 mPa.s at 23° C.

By centrifuging the solution at 1500 rpm onto a silicon wafer coated with an adhesion promoting agent and a subsequent 30 minute drying at 70° C. in a circulating air furnace, 25 micron thick homogeneous layers are obtained. After exposure for 40 seconds with a 350 W high-pressure mercury vapour lamp through a mask, these layers are developed with gamma-butyrolactone/xylene (ratio of volume 1:2) and rinsed with xylene in a spraying process to yield sharp-contoured structured layers. The edge formation and the surface quality of these layers are not impaired by tempering for 1 hour at 150° C. The resolved structures lie at ≦25 μm.

A photostructured layer treated with commercially available flux agents shows after the immersion soldering test at 260° C. and 20 seconds immersion time a homogeneous tear-free surface. The solder material forms pearls which easily run off the lacquer surface.

We claim:

1. A method for manufacturing heatstable structured layers, comprising:
    applying a radiation-sensitive, soluble photopolymer in the form of a layer or film on a substrate;
    irradiating the layer or film through a negative pattern with actinic light or irradiating the layer or film using an actinic light, electron, laser, or ion beam; and
    removing the non-irradiated layer or film portions;
    wherein the photopolymer is

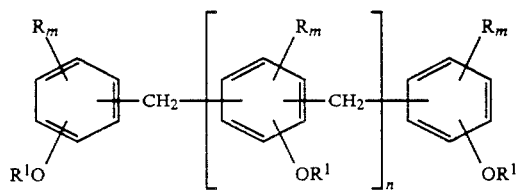

wherein n=1 to 10 and m=1 to 3;
R is hydrogen, halogen or an alkyl group;
$R^1$ is hydrogen or

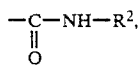

where $R^2$ is an olefinic unsaturated group being derived from an olefinic unsaturated monoisocyanate in the form of a methacrylate group-containing isocyanate, provided that not all $R^1$'s are hydrogen simultaneously.

2. A method according to claim 1 further comprising tempering by heating after the removal step.

3. A method according to claim 1, wherein the photopolymer is employed together with a light- or radiation-sensitive copolymerizable compound.

4. A method according to claim 3 wherein the copolymerizable compound is an acrylate or methacrylate groupcontining compound.

5. A method as in claim 1 wherein the photopolymer is employed together with a photoinitiator or a photosensitizer or a mixture thereof.

6. A method as in claim 5 wherein the photoinitiator or photosensitizer is an alpha-halogenacetophenone, a dialkoxyacetophenone, a benzoylphosphine oxide or Michler's ketone.

7. A method as in claim 1 wherein the photopolymer is an addition reaction product in which one of the reactants is a novolak.

8. A method as in claim 1 wherein the photopolymer is employed together with a mineral filler material.

9. A heat-stable structured layer, prepared as in claim 1.

10. An article of manufacture comprising a component having therein a coating of the structured layer according to claim 9.

11. An article of manufacture according to claim 10 wherein the component is a surface wave filter, an electronic data storage unit, a liquid crystal display or a multilayer circuit.

12. An article of manufacture according to claim 10 wherein the structured layer functions as a solder resist, an insulating layer, a damping substance, an alpha radiation protector, an orientation layer, a dielectric material or a protector-insulator for a structure transfer process.

13. A method as in claim 1 wherein an addition reaction product of hydroxyethyl-(meth)acrylate and 2,4-diisocyanatotoluene is used as the (meth)acrylate group-containing isocyanate.

* * * * *

UNITED STATES PATENT AND TRADEMARK OFFICE
CERTIFICATE OF CORRECTION

PATENT NO. : 4,975,347

DATED : December 4, 1990

INVENTOR(S) : Ahne et al.

It is certified that error appears in the above-identified patent and that said Letters Patent is hereby corrected as shown below:

Column 7, line 41, change "methacrylate" to -- (meth)acrylate --.

Signed and Sealed this

Fourteenth Day of September, 1993

Attest:

BRUCE LEHMAN

Attesting Officer

Commissioner of Patents and Trademarks